United States Patent [19]

Ikeda

[11] Patent Number: 5,124,996
[45] Date of Patent: Jun. 23, 1992

[54] SEMICONDUCTOR LASER ELEMENT HAVING A PLURALITY OF LAYERS EMITTING LIGHTS OF DIFFERENT WAVELENGTHS, AND ITS DRIVING METHOD

[75] Inventor: Sotomitsu Ikeda, Atsugi, Japan

[73] Assignee: Canon Kabushiki Kaisha, Tokyo, Japan

[21] Appl. No.: 663,305

[22] Filed: Mar. 1, 1991

[30] Foreign Application Priority Data

Mar. 2, 1990 [JP] Japan ................................ 2-51415

[51] Int. Cl.$^5$ .................................................. H01S 3/19
[52] U.S. Cl. ............................................ 372/45; 372/8; 372/23; 372/50
[58] Field of Search ................... 372/23, 45, 8, 46, 20, 372/50

[56] References Cited

U.S. PATENT DOCUMENTS

| 4,555,785 | 11/1985 | Scifres et al. | 372/8 |
| 4,817,110 | 3/1989 | Tokuda | 372/45 |
| 4,912,533 | 3/1990 | Takahashi | 357/19 |

OTHER PUBLICATIONS

"cw multiwavelength transverse-junction-stripe lasers grown by molecular beam epitaxy predominantly in single-longitudinal modes", W. T. Tsang, Applied Physics Letters, vol. 36, No. 6, Mar. 15, 1980, pp. 441-443.

Primary Examiner—James W. Davie
Attorney, Agent, or Firm—Fitzpatrick, Cella, Harper & Scinto

[57] ABSTRACT

A semiconductor laser element of which oscillation wavelength is variable at a wide range has a high operative efficiency. It comprises a substrate; a first light emitting layer provided on said substrate and including a resonance cavity, said first light emitting layer permitting the ground energy level and at least one high-order energy level; a second light emitting layer provided on said substrate and including a resonance cavity, said second light emitting layer permitting at least the ground energy level, the band gap of the ground energy level of said second light emitting layer being wider than that of the ground energy level of said first light emitting layer, and one of the band gaps of the high-order energy levels of the first light emitting layer being substantially equal to the band gap of the ground energy level of the second light emitting layer; a barrier layer disposed between said first light emitting layer and said second light emitting layer, said barrier layer having its band gap wider than those of said first and second light emitting layers; a pair of clad layers sandwiching therebetween said barrier layer and said first and second light emitting layers, said clad layers having lower refractive index than those of said first and second light emitting layers; and electrode means for injecting carrier into said first and second light emitting layers. Also disclosed is a driving method for the semiconductor laser element.

10 Claims, 7 Drawing Sheets

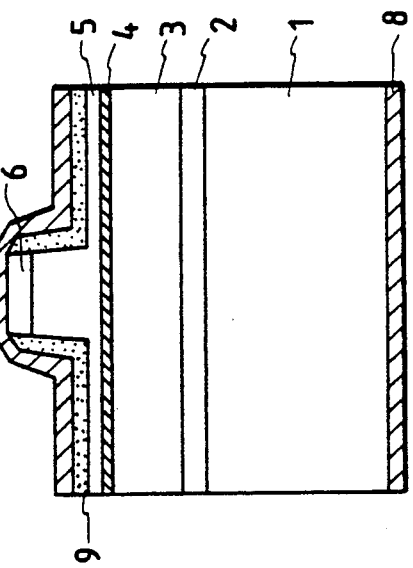
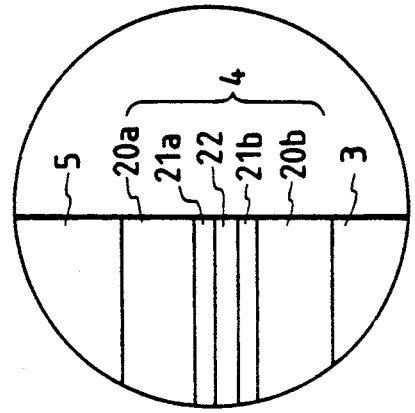
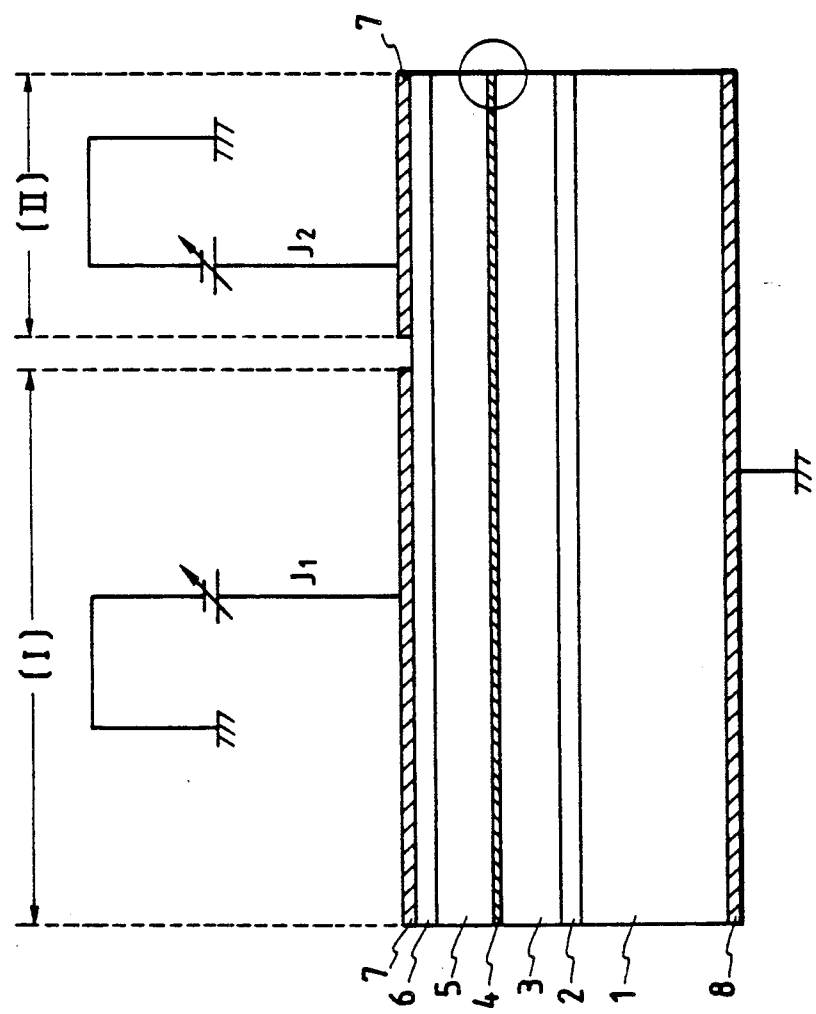

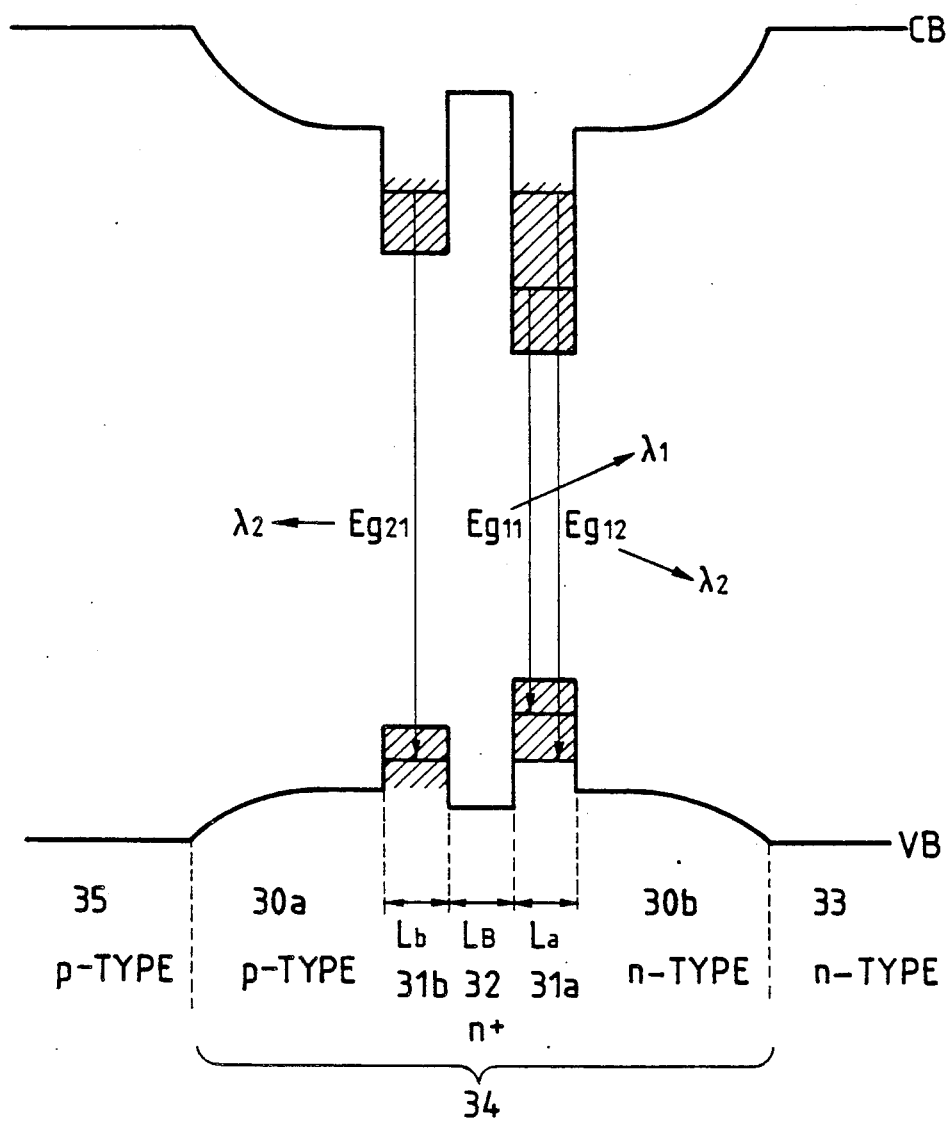

SEMICONDUCTOR LASER ELEMENT HAVING A PLURALITY OF LAYERS EMITTING LIGHTS OF DIFFERENT WAVELENGTHS, AND ITS DRIVING METHOD

BACKGROUND OF THE INVENTION

1. Field of the Invention

This invention relates to a semiconductor laser element and a driving method therefor, and particularly, a semiconductor laser element which emits laser light at different wavelengths by controlling the amount of current flowing through the element, and its driving method.

2. Related Background Art

In recent years, demands for semiconductor laser elements in the field of optical communication or optical information processing have rapidly increased and with that, requests to functions of the elements have become diversified. Semiconductor laser elements of which oscillation wavelength is variable are not an exception. For example, in a case where recording medium such as an optical card or an optical disk, etc. is subjected to laser light to record and reproduce information to and from the recording medium, writing-in due to reproduced light is usually prevented by lowering the power of the output of the reproduced light with respect to recording light. At that time, if the semiconductor laser element of which variable oscillation output wavelength is used and the wavelength of the reproduced light is set to a value which is low in medium sensitivity, then it is possible to avoid the above-mentioned writing-in without substantially lowering the output of the reproduced light, and thus, to provide reproduction of information which is higher in S/N ratio.

For the above-mentioned, requests, as one a first example of prior art, a technique has been proposed in which light emitting layers emitting lights of different wavelengths, respectively are formed on respective separate light directing paths on the same substrate, so that a light emitting layer of a selected wavelength can be caused to laser oscillate by a current injected independently, as shown in Appi. Phys. Lett. Vol. 36, p.442 (1980), for example. This technique provides essentially independent laser elements formed on the same substrate.

On the other hand, as a second example of prior art, what is called a distribution Bragg reflection (DBR) semiconductor laser utilizing a grating as a reflector constituting a resonator has been proposed. This is an element such that an electrode is provided on the grating portion, so that a carrier can be injected, and the oscillation wavelength is varied with the varied refractive index of the grating portion by controlling the amount of the injected current thereinto. In this case, the structure of the light emitting layer, etc. is the same as that in the usual semiconductor laser.

Also, as a third example of prior art, an element has been proposed such that a single quantum well is used as the light emitting layer, light emission from a high-order quantum level, is enabled with the increase of resonator loss, and laser oscillation at different wavelengths is obtained by the light emission from a first quantum level and a second quantum level.

FIG. 1A shows energy bands in such single quantum well and FIG. 1B shows its gain spectrums. In the conventional laser having the usual resonator loss, oscillation threshold gain is Gth, the gain spectrum presents the peak at wavelength $\lambda_1$ for the first quantum level, and the light at this wavelength $\lambda_1$ oscillates. In this third prior art example, when the oscillation threshold gain is made to Gth' with the increase of the resonator loss of this laser, the oscillation of the light at wavelength $\lambda_2$ corresponding to the second quantum level is enabled.

Further, as a fourth example of prior art, U.S. Pat. No. 4,817,110 discloses an element such that two different quantum wells each having an oscillation wavelength of which the difference from the other is small are used as the light emitting layers, and the laser oscillation at the different wavelengths is obtained by the light emission from the respective quantum wells.

However, the above-mentioned prior arts examples have the following problems.

First of all, in the first prior art example, as the wavelength is changed, the light emitting position from the laser varies. For this reason, for example, when an external optical system is assembled so that it can focus light at one wavelength to a point, the focus position would shift by a far distance in comparison with a small shift due to wavelength dispersion if that wavelength is changed. Also, since it needs to drive independently a plurality of individual laser elements formed on the same substrate, producing processes become complicated and difficult, and the size of the element becomes large.

Next, in the second prior art example, the variable wavelength range thereof is narrow. For example, it is only about several nm in a laser using $Al_xGa_{1-x}As$. This is because in the usual semiconductor laser the variable wavelength width depends on the change of Bragg wavelength due to the control of the amount of injected current, and thus, the former is limited to the latter.

Also, in the third prior art example, since it is based on the increase of the resonator loss, it has disadvantages of low efficiency of the laser, large value of the oscillation threshold current and small output, etc. Accordingly, with this element, it is impossible to obtain a two-wavelength laser which enables continuous oscillation at room temperature.

Lastly, in the fourth prior art example, there is not a substantial difference between the two oscillation wavelengths. That is to say, the variable wavelength range is narrow.

SUMMARY OF THE INVENTION

An object of the invention is to provide a semiconductor laser element of which oscillation wavelength is variable, by which the problems of the prior art are eliminated, having a wide variable wavelength range and a high operative efficiency, and its driving method.

The above-mentioned object of this invention is attained by a semiconductor laser element comprising:

a substrate;

a first light emitting layer provided on said substrate and including a resonance cavity, said first light emitting layer permitting the ground energy level and at least one high-order energy level;

a second light emitting layer provided on said substrate and including a resonance cavity, said second light emitting layer permitting at least the ground energy level, the band gap of the ground energy level of said second light emitting layer being wider than that of the ground energy level of said first light emitting layer, and one of the band gaps of the high-order energy levels of the first light emitting layer being substantially equal to the band gap of the ground energy level of the second light emitting layer;

a barrier layer disposed between said first light emitting layer and said second light emitting layer, said barrier layer having its band gap wider than those of said first and second light emitting layers;

a pair of clad layers sandwiching therebetween said barrier layer and said first and second light emitting layers, said clad layers having lower refractive index than those of said first and second light emitting layers; and electrode means for injecting carrier into said first and second light emitting layers.

Said element may be used as a usual laser diode producing light emission by current injection up to a threshold value. Alternatively, it may used as a laser amplifier. In this case, a driving method is adopted in which, first, current which is slightly smaller than the laser oscillation threshold value is injected into the first and second light emitting layers through said electrode means, and then, incidence of outside light having its wavelength near the laser oscillation wavelength is carried out into said element, and last, light having the same wavelength as that of said incident light is picked up from said element.

On the other hand, said semiconductor laser element is used as a wavelength converter. In this case, a driving method is adopted in which, first, current which is slightly smaller than the laser oscillation threshold value is injected into the first and second light emitting layers through said electrode means, and then, incidence of light having its photon energy which is higher than the band gaps of said first and second light emitting layers is carried out into said element from the outside, and last, light which is different in wavelength from said incident light is picked up from said element.

In this invention, the term "band gap" is meant by a transition energy from a certain level in the valence band to a certain level in the conduction band, including a quantization energy, in the case of the quantum well.

In accordance with the structure of this invention, the problems raised from the above-mentioned prior art examples all can be eliminated.

First, as to the problem relating to the first prior art example. In this invention, with the light emitting layers at different wavelengths provided in a single optical waveguide path, the light outgoing position from the laser is fixed though the wavelength is caused to be varied. Also, since there is no need for the provision of independent current injecting means for each wavelength, the manufacturing is easy, and the size of the element can be made substantially equal to that of the usual semiconductor laser.

Also, as to the problem relating to the second prior art example, since this invention causes the light emitting layers provided on the single optical waveguide path to share the respective wavelengths, it is possible to oscillate within a considerably wide wavelength area. For example, if $Al_xGa_{1-x}As$ is used for the light emitting layers, the oscillation wavelength can be varied between about several tens of nanometers (nm) and about several hundreds of nm.

Further, as to the problem relating to the third prior art example, this invention resolves this problem by the structure in which the barrier layer is provided between the adjacent light emitting layers having the respective different wavelengths, said barrier layer having its band gap higher than those of these light emitting layers. Moreover, it is preferable to set the band gap and thickness of the barrier layer to values sufficient to make the carrier density of the light emitting layer having the higher band gap to become higher than that in the case where there is no barrier layer and the carrier density of the light emitting layer having the lower band gap to become lower, when the carrier is injected into these light emitting layers. Thus, comparing the prior art example, gain distribution elongated toward the short wavelength is provided when the same amount of carrier is injected, and thus, it is possible to obtain the light emission more effectively.

In addition thereto, it has been found that in order to make the laser according to this invention to be even more efficient, it is better to dope the barrier layer, or in addition thereto the light emitting layers, to a p-type or an n-type. Specifically, the doping to a polarity opposite to the carrier which is to be injected unevenly of electrons and positive holes is suitable. This is because the carrier which is to be injected evenly can be presupplemented by the doping.

With such contrivances, a variable wavelength laser could be obtained in which the laser efficiency is much higher than those of the prior art and the oscillation threshold current value is low by about 1 to 2 times in comparison with the usual semiconductor lasers in which wavelength is not variable. Specifically, room temperature continuous oscillation which was difficult to obtain by the prior art variable wavelength laser having a large wavelength difference can be attained.

Lastly, the problem relating to the fourth prior art example is removed in this invention, by making the wavelength difference of the light emitting layers large and at the same time by performing the above contrivances.

In general, in the well layer of which band gap of the ground level is small, it presents a large loss against the emitted light from the well layer of which band gap of ground level is large. Furthermore, in this invention, in order to prevent it and increase the gain of the radiated light from the well layer of which band gap of the ground level is large, the band gap of the high-order level in the well layer of which band gap of the ground level is small is caused to substantially agree with the band gap of the ground level in the well layer of which band gap of the ground level is large. Thus, tolerance in design of the height (depth), thickness and doping density, etc. for the barrier and well layers is increased, and a variable wavelength laser element providing a large wavelength difference is easily obtainable.

That is to say, in accordance with this invention, it is easy to use effectively a gain of the high-order level which was not utilized very effectively in the prior art, so that the gain of the short wavelength light is increased.

BRIEF DESCRIPTION OF THE DRAWINGS

FIGS. 7A, 7A-1 and 7B are side section and front section views showing the concrete element structure of the first embodiment according to this invention, respectively.

FIG. 8 is an energy band view neighboring light layers in a second embodiment according to this invention.

DETAILED DESCRIPTION OF THE PREFERRED EMBODIMENTS

This invention will now be explained with its embodiments. In order to make the explanation simpler for understanding, it refers to two wavelengths and thus two light emitting layers. However, it is easily applicable to embodiments relating to three or more wavelengths and light emitting layers.

First, an example using FIG. 2 which is an energy band diagram near the active layers of the semiconductor laser according to this invention will be explained.

Figure 2:
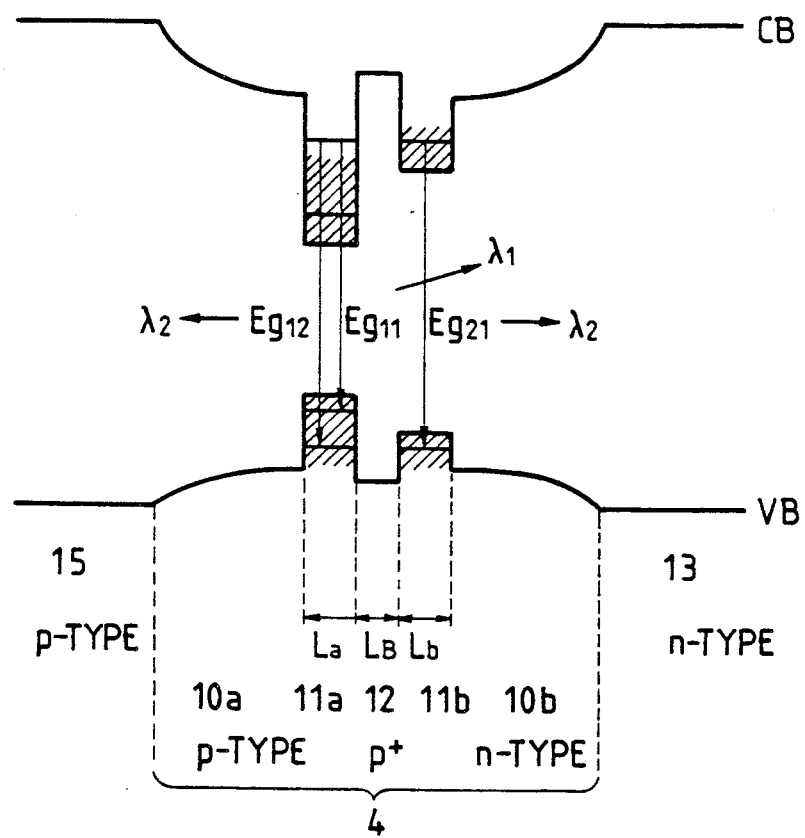
FIG. 2 is an energy band diagram neighboring light emitting layers in a first embodiment according to this invention.

In FIG. 2, reference numerals 10a and 10b are $Al_{xc}Ga_{1-xc}As$ separate confinement (SC) layers of p-type and n-type, respectively. Reference numeral 11a is an $Al_{xa}Ga_{1-xa}As$ light emitting layer, and 11b is an $Al_{xb}Ga_{1-xb}As$ light emitting layer. Reference numeral 12 is a P+—$Al_{XB}Ga_{1-XB}As$ barrier layer.

Although this invention is not related to the SC structure in substance, it is specifically effective in that carrier injection efficiency can be increased and luminance intensity distribution can be beautifully arranged because the light emitting layers 11a and 11b are asymmetric.

In this example, the light emitting layer 11b for short wavelength $\lambda_2$ is provided at the side of an n-type clad layer 13 and the light emitting layer 11a for long wavelength $\lambda_1$ is provided at the side of a p-type clad layer 15, and thus, it is difficult for positive holes injected from the side of the clad layer 15 to reach the light emitting layer 11b for the short wavelength $\lambda_2$ in comparison with their moving in the reverse direction. Therefore, the barrier layer is pre-supplied with positive holes by doping it to a high density p-type.

In such a condition that the positive holes are sufficiently pre-supplied, when current is not flowing, the positive holes are distributed appropriately in both of the light emitting layers 11a and 11b. Under this condition, in order to explain the laser oscillation, it is enough to mainly consider only the distribution of electrons Therefore, the following explanation for the operation will be made in the light of such condition.

Also, the thickness and potential height (depth) of the barrier layer 12 are set to sufficient values to provide the carrier distributions of the light emitting layers or well layers 11a and 11b, respectively, as shown in FIG. 2, when the current near the laser oscillation threshold value flows. If the barrier layer 12 is too thin in thickness or too low in potential, uniform distribution which is the same as in the case where no barrier layer 12 occurs, but in FIG. 2, the barrier layer 12 is set so that electrons are distributed at a larger rate toward the well layer 11b for the short wavelength. However, if the barrier layer 12 is too thick and/or too high, it results in the fact that electrons do not come toward the well layer 11a for the long wavelength, and an optimization for the settings of the barrier layer 12 is needed.

Further, in the example in FIG. 2, a transition energy between high-order levels in the well layer 11a for the long wavelength substantially agrees with a transition energy between ground levels in the well layer 11b for the short wavelength, which constitutes an important requirement.

Figure 3A:
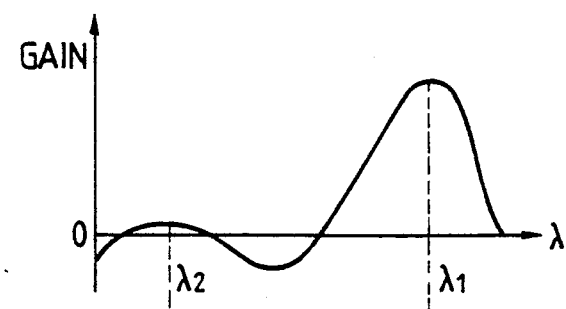
FIGS. 3A–3C are diagrams showing gain spectrums in the first embodiment.
Figure 3B:
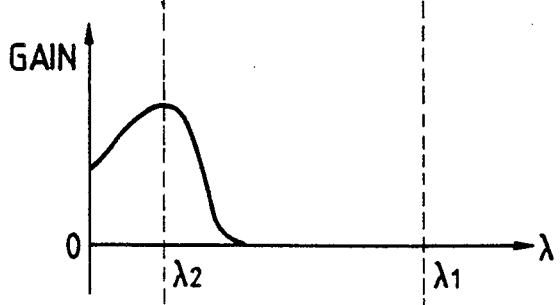
Figure 3C:
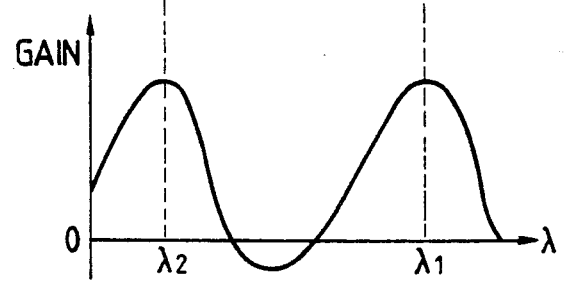

FIG. 3A and FIG. 3B show gain spectrums in well layers 11a and 11b just before the threshold current value, respectively, and FIG. 3C shows a gain spectrum provided by adding the gain spectrums in FIGS. 3A and 3B, considering an optical confinement coefficient. It is apparent that since the band gap $Eg_{12}$ of the second order level of well layer 11a for the long wavelength substantially agrees with the band gap $Eg_{21}$ of the ground level of the well layer 11b for the short wavelength and the gain at the short wavelength $\lambda_2$ in the well layer 11a is positive or slight loss as shown in FIG. 3C, it is possible to easily emit light at the wavelength $\lambda_2$ without a large loss in the well layer 11a.

There is no need for the entire consistence of the band gap $Eg_{12}$ with the band gap $Eg_{21}$, there may be a tolerance of consistence. Therefore, the effects of the invention can be obtained even though the shoulder, for example, of the gain spectrum of the well layer 11a is positioned at the wavelength $\lambda_2$ by the injunction of the current near the threshold current value.

Figure 4:
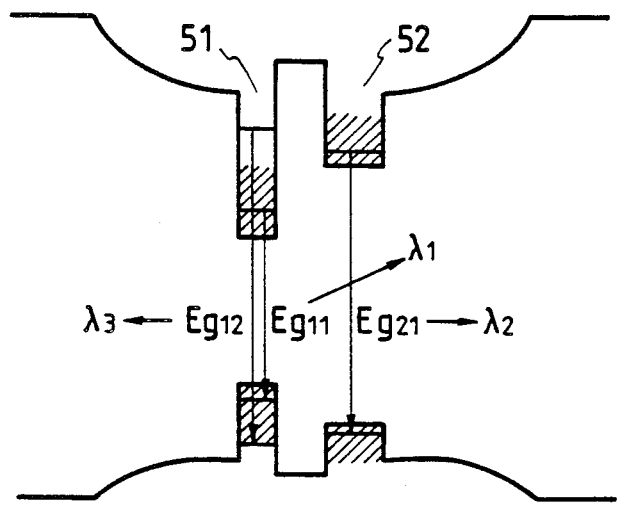
FIG. 4 is an energy band diagram neighboring the light emitting layers of a semiconductor laser element in which the band gap of the high-order energy level of a second light emitting layer is not equal to the band gap of the ground energy level of a first light emitting layer.

For the purpose of comparison, FIG. 4 shows the band gap diagram of a semiconductor laser comprising the active layers of the quantum well structure in which the band gap of the ground level at the well layer (in which band gap of the ground level is high) does not agree with the band gap of the high-order level at the well layer in which band gap of the ground level is low.

Figure 5A:
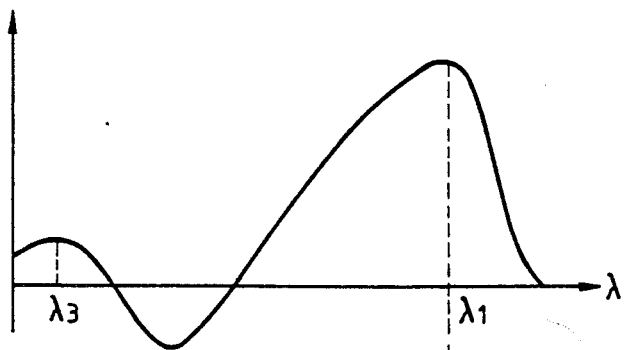
FIGS. 5A–5C are diagrams showing gain spectrums in the laser element explained in connection with FIG. 4.
Figure 5B:
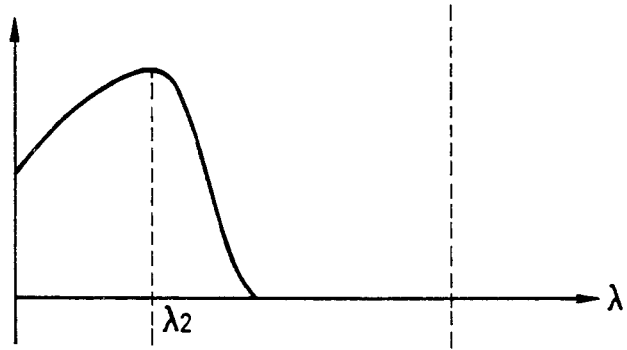
Figure 5C:
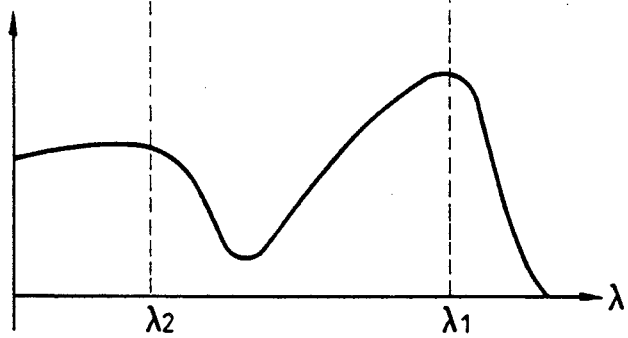

The gain spectrum at the well layer 51 and the gain spectrum at the well layer 52 are shown in FIG. 5A and FIG. 5B, respectively and the gain spectrum obtained by adding the gain spectrums in FIGS. 5A and 5B considering an optical confinement coefficient is shown in FIG. 5C. The wavelengths $\lambda_1$, $\lambda_2$, and $\lambda_3$ have the relationship of $\lambda_1 > \lambda_2 > \lambda_3$, $\lambda_1$ is the wavelength for the energy gap of the ground level of the well layer (in which band gap of the ground level is low), $\lambda_3$ is the wavelength for the energy gap of the second order level of such well layer 51, and $\lambda_2$ is the wavelength for the energy gap of the ground level of the other well layer 52. In the example in FIG. 4, $\lambda_2$ and $\lambda_3$ are not equal, and the well layer 51 acts to become a loss for the light of $\lambda_2$ of the well layer 52, and as a result thereof, the oscillation at the wavelength $\lambda_2$ will occur with difficulty.

Further explanation as to the settings of the well layers or light emitting layers 11a and 11b will be made.

The structure parameters for the active layers 11a and 11b are determined so that the following equation is given as shown in FIG. 3C:

$$\Gamma_1(\lambda_1)g_1(\lambda_1,n_1,p_1) \sim \Gamma_1(\lambda_2)g_1(\lambda_2,n_1,p_1) + \Gamma_2(\lambda_2)g_2(\lambda_2, n_2, p_2)$$

wherein $n_1$, $n_2$ are electron densities in the quantum well layers 11a and 11b, respectively, $p_1$, $p_2$ are positive hole densities in 11a and 11b, respectively, $g_1(\lambda_1, n_1, p_1)$, $g_1(\lambda_2,n_1, p_1)$ and $g(\lambda_2,n_2,p_2)$ are light gains at the oscillation wavelengths $\lambda_1, \lambda_2$ ($g_1$ is for the well layer 11a of the long wavelength, and $g_2$ for the well layer 11b of the short wavelength), respectively, and $\Gamma_1(\lambda_1)$, $\Gamma_1(\lambda_2)$ and $\Gamma_2(\lambda_2)$ are optical confinement coefficients.

In other words, it expresses that the gain $g_1$ ($\lambda_2$, $n_1$, $p_1$) at short wavelength $\lambda_2$ of the active layer 11a for the long wavelength is useful in increasing the gain at short wavelength light $\lambda_2$.

Figure 6:
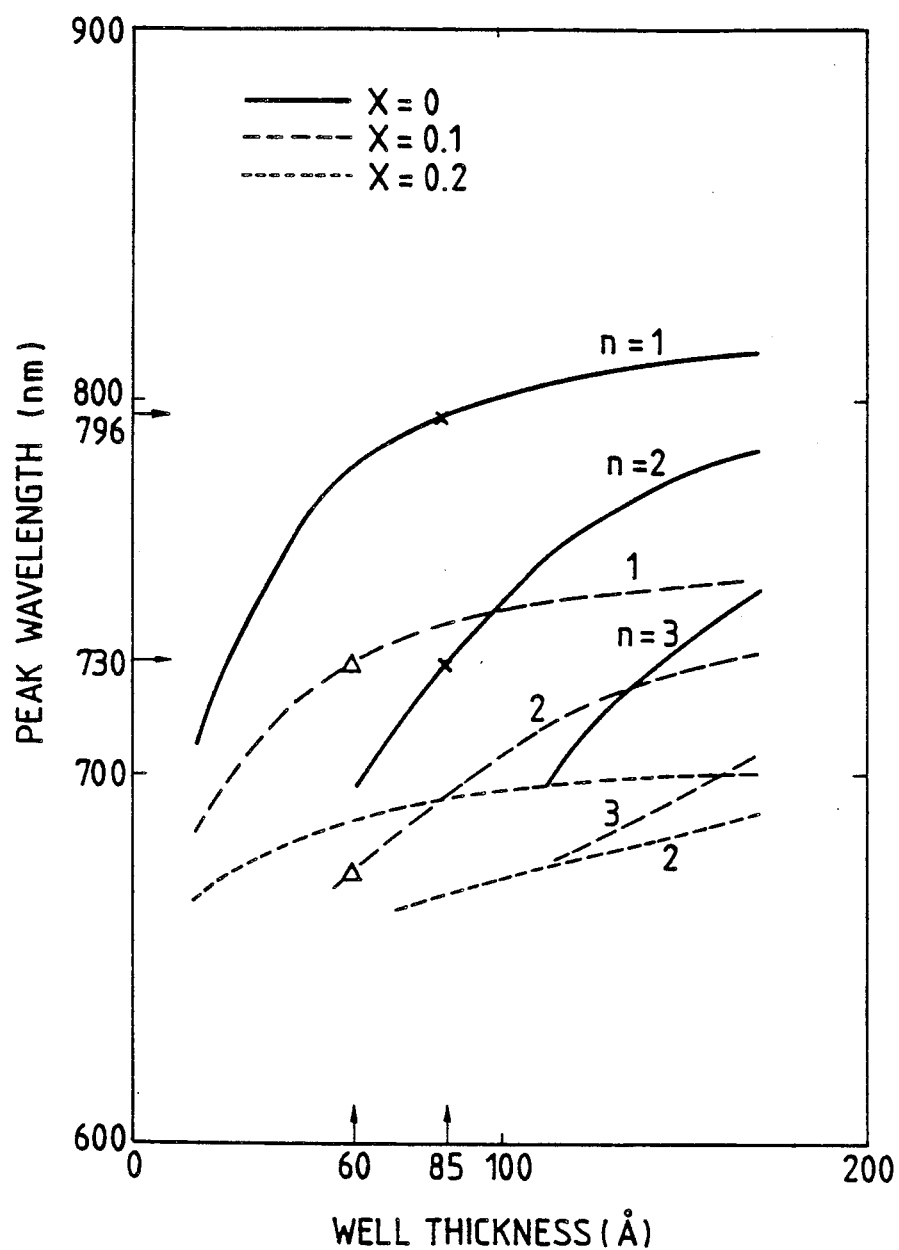
FIG. 6 is a diagram showing the variation of the exciton peak wavelength at 77 K for the quantum well width based on the Kronig-Penney model.

Concrete settings for the well layers 11a and 11b are made, for example, as follows:

The behavior of electrons in a super lattice is provided by the Kronig-Penney model, and the peak wavelength of excitons at 77 K for the respective levels in the super lattices of $Al_xGa_{1-x}As$ well and $Al_{0.3}Ga_{0.7}As$ barrier layers are shown in FIG. 6. In FIG. 6, solid lines show the wavelengths of the respective levels for the well of $x=0$, broken lines for the well of $x=0.1$, and dotted lines for $x=0.2$. Also, in FIG. 6, $n=1$, $n=2$ and $n=3$ correspond to ground, second-order and third-order levels, respectively. As one example, if a well of GaAs ($x=0$), 85Å, and a well $Al_{0.1}Ga_{0.9}As$ ($x=0.1$), 60Å are used, that is the wells are structured with such compositions and thicknesses, then the peak wavelengths of the excitons in the respective wells at 77 K is 796 nm (the wavelength of the ground level of the GaAs well) and 730 nm (the wavelength of the second-order level of the GaAs well, and the wavelength of the ground level of the A10.1Ga0.9As well), and oscillation is produced near 830 nm and 770 nm at room temperature.

The above was the example in which the band gap Eg corresponding to the second-order level transition of one of the wells agrees with the band gap Eg corresponding to the first-order level transition of the other well, but the scope of this invention also includes an example in which the band gap Eg corresponding to the third-order or higher-order level transition of one of the wells agrees with the band gap Eg corresponding to the first-order or higher-order level transition of the other well, which is effective to enlarge the wavelength variable width and promote the oscillation of the short wavelength light.

Incidentally, in the example in FIG. 2, although the band gap of the barrier layer 12 is set to be larger in level than the band gaps of separate layers 10a and 10b neighboring the light emitting layer 11a and 11b, respectively, and is set to be smaller than those of the clad layer 13 and 15, the band gap of the barrier layer 12 may be set to be larger in level than the band gaps of the clad layers 13 and 15, if necessary.

Figure 1A:
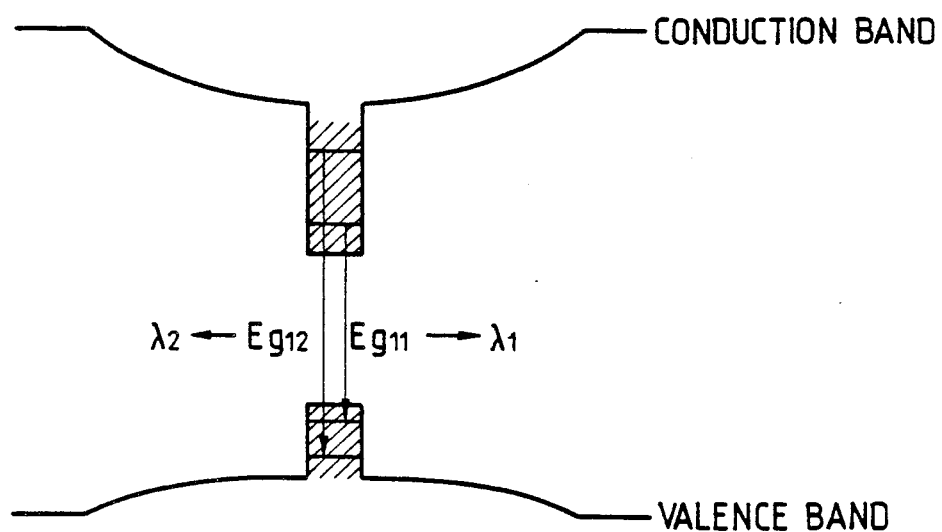
FIG. 1A and FIG. 1B diagrams showing energy bands gain spectrums neighboring the light emitting layer of a prior art semiconductor laser element, respectively.
Figure 1B:
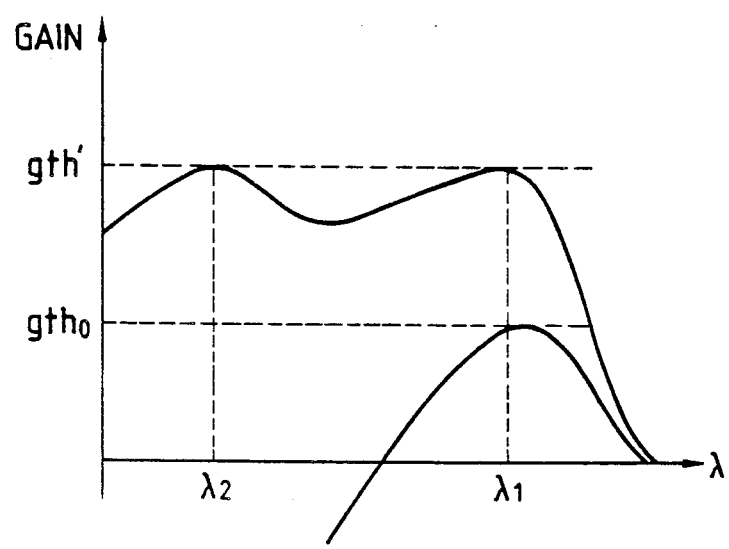

FIG. 7 shows a further concrete embodiment of the semiconductor laser element, according to this invention; FIGS. 7A and 7A-1 are a side section view, and FIG. 7B is a front section view. Such element may be produced in accordance with a molecular beam epitaxy (MBE) method, a metal organic chemical vapor deposition (MOCVD) method or the like, but since the producing steps are the same as the steps of producing the usual semiconductor laser, detailed explanation therefor is condensed.

In FIGS. 7A, 7A-1 and 7B, reference numeral 1 is an n+-GaAs substrate, 2 is a n+-GaAs buffer layer, 3 is an n-$Al_{xc}Ga_{1-xc}$As clad layer, 4 is a light waveguide path arrangement, 5 is a p-$Al_{xc}Ga_{10xc}$As clad layer, 6 is a p+-GaAs cap layer, 7 is an Au/Cr electrode, and 8 is an Au-Ge/Au electrode.

As shown in FIG. 7B, a ridge shaped waveguide path for confining current and light to a stripe-like area is formed in accordance with a method such as an etching method using a reactive ion beam, and after an $Si_3N_4$ film 9 is formed by a plasma CVD method, only the upper portion of the ridge is removed by etching, and then, the electrode 7 is evaporated.

In this example, means for adjusting the wavelength comprises dividing the electrode 7 into two so that current flows independently through the divided electrode portions, as shown in FIG. 7. The current is injected into these electrode portions 7 at different current densities $J_1$ and $J_2$, and their ratio and values are varied. Thus the oscillation wavelength is varied by slightly changing the wavelength dispersion of effective gains of the whole laser.

The light waveguide arrangement 4 is laminated, as shown in FIG. 7A, by stacking a p-type $Al_{xs}Ga_{1-xs}As$ SC layer 20a, an $Al_{xa}Ga_{i-xa}As$ light emitting layer 21a, a p+-$Al_{xB}Ga_{1-xB}As$ barrier layer 22, an $Al_{xb}Ga_{10xb}As$ light emitting layer 21b, an n-type $Al_{xs}Ga_{1-xs}As$ SC layer 20b, from top to bottom.

The way of changing the oscillation wavelength may be one for controlling the wavelength in accordance with the amount of current with a single electrode and not dividing the electrode into two. In this case, it has been confirmed that as the current is increased, first the light at the long wavelength is oscillated, and then, the light at the short wavelength, is also oscillated. As the current is further increased, two cases occur; (i) in one case the oscillation of the long wavelength light is stopped, (ii) in the other case such oscillation is continued. It has been found that if the light emitting layers 21a and 21b, and the barrier layer 22 are set to be $g_1(\lambda_2,n_1,p_1)>0$, the operation of (i) is obtained, and if the light emitting layers and the barrier layer are set to be $g_1(\lambda_2,n_1,P_1) \leq 0$ as has been explained with respect to FIG. 2, the operation of (ii) is obtained. Specifically, the case of (i) has wide applicability because the wavelength switching can be entirely carried out.

The above-mentioned embodiment is the one for increasing the gain of the short wavelength light by unevenly injecting electrons into the respective light emitting layers. However, the same effect is obtainable as well by unevenly injecting positive holes. This example will be explained below.

FIG. 8 is a diagram showing energy bands adjacent to the light emitting layers in the second embodiment of the semiconductor laser element according to this invention.

In FIG. 8, reference numerals 30a and 30b are p-type and n-type $As_{xc}Ga_{1-xc}As$ separate confinement (SC) layers, respectively, 31a is an $Al_{xa}Ga_{1-xa}As$ light emitting layer, 31b is an $Al_{sb}Ga_{1-xb}As$ light emitting layer, and 32 is an n+-$Al_{sB}Ga_{1-xB}As$ barrier layer.

Since in this example, the light emitting layer 31b for the short wavelength $\lambda_2$ is disposed at the side of the p-type clad layer 35 and the light emitting layer 31a for the long wavelength $\lambda_1$ is disposed at the side of the n-type clad layer 33, the positive holes injected from the side of the clad layer 35 have difficulty reaching the light emitting layer 31b for the short wavelength $\lambda_2$, as compared with their moving in the reverse direction, and the positive holes are injected unevenly into the two light emitting layers. On the other hand, for the electrons, the barrier layer 32 is presupplied with electrons by doping it to n-type at high density so that the electrons can be injected evenly. Thus, with such sufficiently presupplied electrons, the electrons are distributed appropriately in both of the light emitting layers 31a and 31b when the current is not flowing. In such case, in order to explain the laser oscillation, it is enough to consider mainly only the distribution of positive holes.

Incidentally, in general, since the positive holes have their mobility which is about a twentieth of that of the electrons, the positive holes are apt to be injected unevenly whereas the electrons are apt to be injected evenly. Therefore, in the above-mentioned embodiment, the barrier layer may be a non-doped semiconductor layer, not doped to n-type.

Also, the thickness and potential height (depth) of the barrier layer 32 are set to sufficient values to provide the carrier distributions of the light emitting layers or well layers 31a and 31b, respectively, as shown in FIG. 8, when the current near, the laser oscillation threshold value is flowing. If the barrier layer 32 is too thin in thickness or too low in potential, uniform distribution which is the same as in the case where there is no barrier layer 32 occurs, but in FIG. 8, the barrier layer 32 is set so that positive holes are distributed at a larger rate toward the well layer 31b for the short wavelength. However, if the barrier layer 32 is too thick and/or too high, it results in the fact that positive holes do not come toward the well layer 31a for the long wavelength and an optimization for the settings of the barrier layer 32 is needed.

Further, in the example in FIG. 8, a transition energy between high-order levels in the well layer 31a for the long wavelength substantially agrees with a transition energy between ground levels in the well layer 31b for the short wavelength, which constitutes an important requirement.

The operation of this embodiment is equal to that of the above-mentioned first embodiment, and therefore, its description is omitted.

In the above-mentioned embodiments, for the convenience of explanation, the case in which $Al_xGa_{1-x}As$ is used as the semiconductor was referred to, but it will be easily appreciated that any semiconductor materials which can become a heterostructure can be used. Also, although the case in which the ridge type waveguide path is used as the structure for confining light and current was explained, any methods which have been used in the semiconductor laser may be utilized.

These structures and producing methods are clear from Applied Physics Letters and IEEE Journal of Quantum Electronics, for example, published in the last fifteen years, and therefore, the explanation thereof is emitted.

Also, the number and type of the light emitting layers are not limited to two as above, and it is clear that there may be three or more.

Also, the laser element according to this invention can be used as a high efficient optical amplifier which operates at a wide wavelength range. In this case, current which is slightly smaller than the laser oscillation threshold current value is injected into the laser element according to this invention, light having its wavelength neighboring the laser oscillation light wavelength is caused to enter into the laser element from an external light source through one of the end faces of the laser element, and light having the same wavelength as that of said incident light is pitched up from the other end face.

Since the laser element according to this invention has a gain at a wider wavelength range than those of the prior art elements, it can operate at a wider wavelength extent and can be used as a highly efficient optical amplifier which can easily oscillate the short wavelength light.

Also, the laser element can be used as a highly efficient light wavelength converter, which operates at a wide wavelength range. In this case, current which is slightly smaller than the laser oscillation threshold current value is injected into the laser element according to this invention, and light having its photon energy which is higher than the band gaps of the light emitting layers is caused to enter into the laser element from an external light source. Whereupon, since carrier is produced, light having a wavelength which is different from that of the incident light is radiated from the light emitting layer of the element, and goes out from the end face. The light which goes out from the element end face has its wavelength near wavelength $\lambda_1$ if the pre-biased current is near the light threshold current value for the wavelength $\lambda_1$, and has its wavelength near wavelength $\lambda_2$ if the pre-biased current is near the light threshold current value for the wavelength $\lambda_2$. Accordingly, the element according to this invention can operate at a wider wavelength extent and can be used as a highly efficient light wavelength converter which can easily oscillate the short wavelength light.

I claim:

1. A semiconductor laser element comprising:
   a substrate;
   a first light emitting layer comprising a resonance cavity, said first light emitting layer being provided on said substrate, said first light emitting layer permitting the ground energy level and at least one high-order energy level;
   a second light emitting layer comprising a resonance cavity, said second light emitting layer being provided on said substrate, and said second light emitting layer permitting at least the ground energy level, the band gap of the ground energy level of said second light emitting layer being wider than that of the ground energy level of said first light emitting layer, and one of the band gaps of the high-order energy levels of said first light emitting layer being substantially equal to the band gap of the ground energy level of said second light emitting layer;
   a barrier layer disposed between said first light emitting layer and said second light emitting layer, said barrier layer having its band gap wider than those of said first and second light emitting layers;
   a pair of clad layers sandwiching therebetween said barrier layer and said first and second light emitting layers, said clad layers having lower refractive indices than those of said first and second light emitting layers; and
   electrode means for injecting carrier into said first and second light emitting layers.

2. A semiconductor laser element according to claim 1 wherein the band gap and thickness of said barrier layer are so set that the carrier density of said second light emitting layer becomes higher and the carrier density of said first light emitting layer becomes lower, as compared with the case where there is no barrier layer, when the carrier is injected into said light emitting layers.

3. A semiconductor laser element according to claim 1 wherein the following equation is satisfied:

$$\Gamma_1(\lambda_1)g_1(\lambda_1,n_1,P_1) \sim \Gamma_1(\lambda_2)g_1(\lambda_2,n_1,P_1) + \Gamma_2(\lambda_2)g_2(\lambda_2,n_2,P_2)$$

in which $n_1$ and $n_2$ are the electron densities of said first and second light emitting layers, respectively, $P_1$ and $P_2$ are the positive hole densities of said first and second light emitting layers, respectively, $\lambda_1$ is the first oscillation wavelength of said first light emitting layer, $\lambda_2$ is the second oscillation wavelength of said first light emitting layer and the oscillation wavelength of said second light emitting layer, $g_1(\lambda_1,n_1,P_1)$ is the optical gain at wavelength $\lambda_1$ of said first light emitting layer, $g_1(\lambda_2,n_1,P_1)$ is the optical gain at wavelength $\lambda_2$ of said first light emitting layer, $g_2(\lambda_2,n_2,P_2)$ is the optical gain at wavelength $\lambda_2$ of said second light emitting layer, $\Gamma_1(\lambda_1)$ is the optical confinement coefficient for the light at wavelength $\lambda_1$ of said first light emitting layer, $\Gamma_1(\lambda_2)$ is the optical confinement coefficient for the light at wavelength $\lambda_2$ of said first light emitting layer, and $\Gamma_2(\lambda_2)$ is the optical confinement coefficient for the light at wavelength $\lambda_2$ of said second light emitting layer.

4. A semiconductor laser element according to claim 1 wherein said element is laminated by stacking on a substrate consisting of n-type semiconductor a first clad layer consisting of n-type semiconductor, a second light emitting layer, a barrier layer consisting of high density p-type semiconductor, a first light emitting layer and a second clad layer consisting of p-type semiconductor, in order.

5. A semiconductor laser element according to claim 1 wherein said element is laminated by stacking on a substrate a first clad layer consisting of n-type semiconductor, a first light emitting layer, a barrier layer consisting of high density n-type semiconductor, a second light emitting layer and a second clad layer consisting of p-type semiconductor, in order.

6. A semiconductor laser element according to claim 1, further comprising a pair of separate confinement layers disposed between the respective clad layers, and said first and second light emitting layers, respectively, said separate confinement layers having their band gaps higher in level than those of said first and second light emitting layer and lower than that of said clad layer.

7. A semiconductor laser element according to claim 1, wherein said electrode means comprising a plurality of electrodes arranged in the resonance direction and controlling independently the amount of carrier injected from each electrode.

8. A semiconductor laser element according to claim 1, wherein said substrate and said layers comprising GaAs or AlGaAs.

9. A driving method for a semiconductor laser element comprising:
a substrate;
a first light emitting layer comprising a resonance cavity, said first light emitting layer being provided on said substrate, said first light emitting layer permitting the ground energy level and at least one high-order energy level;
a second light emitting layer comprising a resonance cavity, said second light emitting layer being provided on said substrate, said second light emitting layer permitting at least the ground energy level, the band gap of the ground energy level of said second light emitting layer being wider than that of the ground energy level of said first light emitting layer, and one of the band gaps of the high-order energy levels of said first light emitting layer being substantially equal to the band gap of the ground energy level of said second light emitting layer;
a barrier layer disposed between said first light emitting layer and said second light emitting layer, said barrier layer having its band gap wider than those of said first and second light emitting layers;
a pair of clad layers sandwiching therebetween said barrier layer and said first and second light emitting layers, said clad layers having lower refractive indices that those of said first and second light emitting layers; and
electrode means for injecting carrier into said first and second light emitter layers:
said method comprising steps of:
injecting current which is slightly smaller than the laser oscillation threshold value from said electrode means into said first and second light emitting layers;
applying light having its wavelength near the laser oscillation wavelength to said element from the external; and
picking up light having the same wavelength as that of an incident light from said element.

10. A driving method for a semiconductor laser element comprising:
a substrate;
a first light emitting layer comprising resonance cavity, said first light emitting layer being provided on said substrate, said first light emitting layer permitting the ground energy level and at least one high-order energy level;
a second light emitting layer comprising resonance cavity, said second light emitting layer being provided on said substrate, said second light emitting layer permitting at least the ground energy level, the band gap of the ground energy level of said second light emitting layer being wider than that of the ground energy level of said first light emitting layer, and one of the band gaps of the high-order energy levels of said first light emitting layer being substantially equal to the band gap of the ground energy level of said second light emitting layer;
a barrier layer disposed between said first light emitting layer and said second light emitting layer, said barrier layer having its band gap wider than those of said first and second light emitting layers;
a pair of clad layers sandwiching therebetween said barrier layer and said first and second light emitting layers, said clad layers having lower refractive indices that those of said first and second light emitting layers; and
electrode means for injecting carrier into said first and second light emitting layers:
said method comprising the steps of:
injecting current which is slightly smaller than the laser oscillation threshold value from said electrode means into said first and second light emitting layers;
applying light having its photon energy which is higher in level than the band gaps of said first and second light emitting layers, to said element from the external; and
picking up light having its wavelength which is different from an incident light from said element.

* * * * *

UNITED STATES PATENT AND TRADEMARK OFFICE
CERTIFICATE OF CORRECTION

PATENT NO. : 5,124,996
DATED : June 23, 1992
INVENTOR(S) : SOTOMITSU IKEDA

Page 1 of 2

It is certified that error appears in the above-identified patent and that said Letters Patent is hereby corrected as shown below:

COLUMN 1

Line 18, "increased" should read --increased,--.
Line 37, "above-mentioned," should read --above-mentioned-- and "one" should be deleted.
Line 44, "Appi. Phys. Lett." should read --Appl. Phys. Lett.--.

COLUMN 2

Line 1, "Gth ," should read --$Gth_0$,--.
Line 16, "arts" should read --art--.

COLUMN 3

Line 44, "the problems" should read --all the problems--.
Line 45, "all" should be deleted.

COLUMN 7

Line 2, "$g(\lambda_2, n_2, p_2)$" should read --$g_2(\lambda_2, n_2, p_2)$--.
Line 66, "$p-Al_{xc}Ga_{10xc}As$" should read --$p-Al_{xc}Ga_{1-xc}As$--.

COLUMN 8

Line 4, "an" should read --a--.
Line 20, "$Al_{xb}Ga_{10xb}As$" should read --$Al_{xB}Ga_{1-xB}As$--.
Line 55, "$n^+-Al_{sB}Ga_{1-xB}As$" should read --$n^+-Al_{xB}Ga_{1-xB}As$--.

COLUMN 9

Line 18, "near," should read --near--.
Line 53, "emitted" should read --omitted--.

UNITED STATES PATENT AND TRADEMARK OFFICE
CERTIFICATE OF CORRECTION

PATENT NO. : 5,124,996
DATED : June 23, 1992
INVENTOR(S) : SOTOMITSU IKEDA

It is certified that error appears in the above-identified patent and that said Letters Patent is hereby corrected as shown below:

COLUMN 10

Line 62, "1" should read --1,--.

COLUMN 11

Line 2, "1" should read --1,--.
    Line 26, "1" should read --1,--.
    Line 34, "1" should read --1,--.
    Line 46, "layer" (first occurrence) should read --layers--.
    Line 53, "comprising" should read --comprise--.

COLUMN 12

Line 13, "that" should read --than--.
    Line 17, "steps" should read --the steps--.
    Line 30, "resonance" should read --a resonance--.
    Line 35, "resonance" should read --a resonance--.

Signed and Sealed this

Twenty-first Day of September, 1993

*Attest:*

BRUCE LEHMAN

*Attesting Officer*     *Commissioner of Patents and Trademarks*